US012191228B2

(12) United States Patent
Greenhill

(10) Patent No.: US 12,191,228 B2
(45) Date of Patent: Jan. 7, 2025

(54) HEAT DISSIPATION USING NANOSCALE MATERIALS

(71) Applicant: Sanctioned Risk Solutions, Inc., Davidson, NC (US)

(72) Inventor: Zachary R. Greenhill, Davidson, NC (US)

(73) Assignee: Sanctioned Risk Solutions, Inc., Davidson, NC (US)

( * ) Notice: Subject to any disclaimer, the term of this patent is extended or adjusted under 35 U.S.C. 154(b) by 1026 days.

(21) Appl. No.: 16/091,939

(22) PCT Filed: Apr. 6, 2017

(86) PCT No.: PCT/US2017/026407
§ 371 (c)(1),
(2) Date: Oct. 5, 2018

(87) PCT Pub. No.: WO2017/177040
PCT Pub. Date: Oct. 12, 2017

(65) Prior Publication Data
US 2019/0115278 A1 Apr. 18, 2019

Related U.S. Application Data

(60) Provisional application No. 62/319,005, filed on Apr. 6, 2016.

(51) Int. Cl.
*H01L 23/373* (2006.01)
*B32B 9/00* (2006.01)
(Continued)

(52) U.S. Cl.
CPC ............ *H01L 23/3735* (2013.01); *C08K 3/04* (2013.01); *C08K 3/042* (2017.05); *C09D 7/70* (2018.01);
(Continued)

(58) Field of Classification Search
CPC ............ H01L 23/3735; H01L 23/3738; H01L 23/3737; H01L 23/373; C08K 3/042;
(Continued)

(56) References Cited

U.S. PATENT DOCUMENTS 2,978,584 A 4/1961 Loconti et al.
3,485,658 A 12/1969 Iler
(Continued)

FOREIGN PATENT DOCUMENTS

DE 3404272 10/1987
DE 3936991 10/1990
(Continued)

OTHER PUBLICATIONS

"Materials & Processes: Resin matrices for composites". CW Composites World: Delivering the Global Composites Market, Mar. 25, 2016 [online]. [retrieved Feb. 13, 2021]. Retrieved from the Internet:<URL:https://www.compositesworld.com/articles/the-matrix>.*

(Continued)

*Primary Examiner* — Ljiljana V. Ciric
(74) *Attorney, Agent, or Firm* — Elevated IP, LLC

(57) ABSTRACT

Heat dissipation systems include a plurality of heat dissipating layers, including gradient nanoparticle layers and carbon allotrope layers, applied to substrates. The gradient nanoparticle layers have first and second nanoparticles that both have diameters less than 500 nm, and the diameters differ from one another in length by 10% or more. The carbon allotrope layers include carbon allotrope particles suspended in a matrix that includes one or more polymers heat stable up to 500 C.

19 Claims, 3 Drawing Sheets

(51) Int. Cl.
| | |
|---|---|
| *B32B 9/04* | (2006.01) |
| *B33Y 10/00* | (2015.01) |
| *B82Y 30/00* | (2011.01) |
| *C08K 3/04* | (2006.01) |
| *C09D 7/40* | (2018.01) |
| *H01B 3/02* | (2006.01) |

(52) U.S. Cl.
CPC ........... *H01B 3/025* (2013.01); *H01L 23/373* (2013.01); *H01L 23/3737* (2013.01); *H01L 23/3738* (2013.01); *B32B 9/007* (2013.01); *B32B 9/048* (2013.01); *B32B 2264/108* (2013.01); *B33Y 10/00* (2014.12); *B82Y 30/00* (2013.01); *C08K 3/041* (2017.05)

(58) Field of Classification Search
CPC .. C08K 3/04; C08K 3/041; C09D 7/70; B32B 9/007; B32B 9/048; B32B 2264/108; B33Y 10/00; B82Y 30/00; H01B 3/025
See application file for complete search history.

(56) References Cited

U.S. PATENT DOCUMENTS

| | | | |
|---|---|---|---|
| 4,014,926 A | 3/1977 | Dear et al. | |
| 4,090,967 A | 5/1978 | Falk | |
| 4,179,979 A | 12/1979 | Cook et al. | |
| 4,186,648 A | 2/1980 | Clausen et al. | |
| 4,585,685 A | 4/1986 | Forry et al. | |
| 4,719,151 A | 1/1988 | Chyung et al. | |
| 5,540,951 A | 7/1996 | Nagayama et al. | |
| 5,635,288 A | 6/1997 | Park | |
| 5,747,152 A | 5/1998 | Oka et al. | |
| 5,762,841 A | 6/1998 | Shimai et al. | |
| 5,834,101 A | 11/1998 | Hayashi | |
| 5,942,015 A | 8/1999 | Culler et al. | |
| 6,028,020 A | 2/2000 | Tanaka et al. | |
| 6,225,246 B1* | 5/2001 | Darcovich | B01D 67/0046 |
| | | | 210/500.21 |
| 6,537,654 B1 | 3/2003 | Gruber et al. | |
| 6,832,735 B2 | 12/2004 | Yadav et al. | |
| 7,002,754 B2 | 2/2006 | Baer et al. | |
| 7,268,364 B2 | 9/2007 | Koch et al. | |
| 7,471,503 B2 | 12/2008 | Bruner et al. | |
| 7,549,366 B2 | 6/2009 | Park et al. | |
| 7,625,149 B2 | 12/2009 | Hanson et al. | |
| 7,685,922 B1 | 3/2010 | Martin et al. | |
| 7,691,478 B2 | 4/2010 | Avaltroni et al. | |
| 7,740,940 B2 | 6/2010 | Hanson | |
| 7,832,023 B2 | 11/2010 | Crisco | |
| 7,879,437 B2 | 2/2011 | Hanson | |
| 7,901,777 B2 | 3/2011 | Hanson | |
| 7,989,069 B2 | 8/2011 | Bruner et al. | |
| 8,025,974 B2 | 9/2011 | Hanson et al. | |
| 8,048,487 B2 | 11/2011 | Hanson | |
| 8,053,081 B2 | 11/2011 | Petcavich et al. | |
| 8,067,103 B2 | 11/2011 | Hanson | |
| 8,178,004 B2 | 5/2012 | Hanson | |
| 8,236,426 B2 | 8/2012 | Hanson et al. | |
| 9,060,560 B2 | 6/2015 | Greenhill et al. | |
| 9,328,788 B2* | 5/2016 | Greenhill | C09D 1/00 |
| 9,545,584 B2* | 1/2017 | Khripin | B01D 11/028 |
| 9,982,736 B2* | 5/2018 | Greenhill | B32B 27/14 |
| 10,926,513 B2* | 2/2021 | Greenhill | F42D 5/045 |
| 10,954,167 B1* | 3/2021 | Garnier | C01B 32/97 |
| 11,718,067 B2* | 8/2023 | Greenhill | B32B 27/42 |
| | | | 428/323 |
| 2002/0118435 A1 | 8/2002 | Foulger et al. | |
| 2003/0031438 A1 | 2/2003 | Kambe et al. | |
| 2003/0044543 A1 | 3/2003 | Okamoto | |
| 2003/0122111 A1 | 7/2003 | Glatkowski | |
| 2004/0007702 A1 | 1/2004 | Avniel et al. | |
| 2004/0038007 A1 | 2/2004 | Kotov et al. | |
| 2004/0071422 A1 | 4/2004 | Aylward et al. | |

| | | | |
|---|---|---|---|
| 2004/0247808 A1 | 12/2004 | Cooper et al. | |
| 2005/0066805 A1 | 3/2005 | Park et al. | |
| 2005/0158551 A1 | 7/2005 | Rhoads et al. | |
| 2005/0159001 A1 | 7/2005 | Kim et al. | |
| 2005/0189014 A1 | 9/2005 | Gaudiana et al. | |
| 2006/0011054 A1 | 1/2006 | Walthall et al. | |
| 2006/0286883 A1 | 12/2006 | Brown et al. | |
| 2007/0003753 A1 | 1/2007 | Asgari | |
| 2007/0220662 A1 | 9/2007 | Pierce | |
| 2007/0293107 A1 | 12/2007 | Follo et al. | |
| 2007/0295242 A1 | 12/2007 | Shim et al. | |
| 2008/0108122 A1 | 5/2008 | Paul et al. | |
| 2008/0131709 A1 | 6/2008 | Hanson et al. | |
| 2008/0286559 A1 | 11/2008 | Lee et al. | |
| 2009/0087644 A1 | 4/2009 | Supriya et al. | |
| 2009/0130425 A1 | 5/2009 | Whitaker | |
| 2009/0217812 A1 | 9/2009 | Whitaker et al. | |
| 2009/0314350 A1 | 12/2009 | Jung et al. | |
| 2009/0324910 A1 | 12/2009 | Gemici et al. | |
| 2010/0012004 A1 | 1/2010 | Telander | |
| 2010/0178512 A1 | 7/2010 | Giesenberg et al. | |
| 2010/0215985 A1 | 8/2010 | Kitano | |
| 2011/0091729 A1 | 4/2011 | Hanson | |
| 2011/0168003 A1 | 7/2011 | Kim | |
| 2011/0192274 A1 | 8/2011 | Fingerhut | |
| 2011/0195246 A1 | 8/2011 | Hanson et al. | |
| 2011/0198113 A1 | 8/2011 | Hanson | |
| 2011/0212320 A1 | 9/2011 | Greenhill et al. | |
| 2011/0314997 A1 | 12/2011 | Carberry et al. | |
| 2012/0003481 A1 | 1/2012 | Hanson | |
| 2012/0004388 A1 | 1/2012 | Hanson | |
| 2012/0088036 A1 | 4/2012 | Greenhill et al. | |
| 2012/0291620 A1 | 11/2012 | Yeshurun | |
| 2013/0006205 A1 | 1/2013 | McKiernan et al. | |
| 2013/0126146 A1 | 5/2013 | Chiang | |
| 2013/0273273 A1* | 10/2013 | Greenhill | F41H 1/04 |
| | | | 428/323 |
| 2014/0023805 A1 | 1/2014 | Greenhill et al. | |
| 2014/0099472 A1 | 4/2014 | Greenhill et al. | |
| 2014/0113086 A1* | 4/2014 | Greenhill | C09D 1/00 |
| | | | 428/34.1 |
| 2015/0194713 A1 | 7/2015 | Jin et al. | |
| 2015/0237929 A1* | 8/2015 | Greenhill | F41H 1/08 |
| | | | 428/688 |
| 2016/0071655 A1 | 3/2016 | Li et al. | |
| 2016/0159033 A1 | 6/2016 | Greenhill et al. | |
| 2019/0115278 A1* | 4/2019 | Greenhill | C09D 7/70 |
| 2019/0128357 A1 | 5/2019 | Greenhill et al. | |
| 2020/0095389 A1* | 3/2020 | Gosselin | C08K 9/04 |
| 2020/0385272 A1* | 12/2020 | Cross | C10M 103/02 |
| 2021/0115211 A1* | 4/2021 | Allain | A61F 2/30771 |
| 2021/0197518 A1* | 7/2021 | Greenhill | B32B 9/048 |
| 2021/0269366 A1* | 9/2021 | Garnier | B82Y 30/00 |

FOREIGN PATENT DOCUMENTS

| | | |
|---|---|---|
| DE | 10107340 | 8/2002 |
| DE | 10305405 | 8/2004 |
| GB | 2365750 | 2/2002 |
| JP | 2001129906 | 5/2001 |
| JP | 2001-192275 | 7/2001 |
| JP | 03-224577 | 10/2001 |
| JP | 2008-169935 | 7/2008 |
| JP | 2015-052095 | 3/2015 |
| WO | WO-2003/025493 | 3/2003 |
| WO | 2008054867 A2 | 5/2008 |
| WO | WO-2008/054867 | 5/2008 |
| WO | WO-2009/058453 | 5/2009 |
| WO | WO-2009/143405 | 11/2009 |
| WO | WO-2010/019609 | 2/2010 |
| WO | WO-2010/019612 | 2/2010 |
| WO | WO-2012/054472 | 4/2012 |
| WO | WO-2014/008031 | 1/2014 |
| WO | WO-2014/197082 | 12/2014 |
| WO | WO-2017/177040 | 10/2017 |

(56) References Cited

OTHER PUBLICATIONS

Mangalgiri, P.D., "Polymer-matrix Composites for High-temperature Applications", Apr. 2005, Defence Science Journal, vol. 55, No. 2, pp. 175-193. (Year: 2005).*
Advanced Industrial, "Ultra High Temperature Materials," Mar. 2016, [online] [retrieved on Jun. 12, 2017]. Retrieved from the Internet: <URL: https://web.archive.org/web/20160329142934/http://www.cncplastics.com/ultrahightemp.php>.
Institute of Materials Research and Engineering Media Release, "Body armour and protective sports padding made from cornstarch solution?" Jul. 28, 2010, 4 pages.
International Search Report and Written Opinion for related International Application No. PCT/US2017/026407, mailed Jun. 28, 2017.
International Search Report for related International Application No. PCT/US14/27822, mailed Jan. 27, 2015.
International Search Report for related International Application No. PCT/US2008/072808, mailed Sep. 17, 2009.
International Search Report for related International Application No. PCT/US2009/053462, mailed Oct. 19, 2009.
International Search Report for related International Application No. PCT/US2009/053465, mailed Jul. 26, 2010.
International Search Report for related International Application No. PCT/US2011/056696, mailed May 8, 2012.
International Search Report for related International Application No. PCT/US2013/047515, mailed Nov. 22, 2013.
Kawakami et al., "Bubble sheet used as impact buffer, heat insulating material, has multiple air bubbles formed on surface of base sheet arranged in mutually crossing fashion along longitudinal direction," Thomson Scientific, week 200145; vol. 2001, Nr: 45.
Leeman et al., "Varve formation and the climatic record in an Alpine proglacial lake: calibrating annually-laminated sediments against hydrological and meteorological data," The Holocene, 1994, 4:1, pp. 1-8.
Supplementary European Search Report for related European Application No. EP 11834986, mailed May 2, 2014.
U.S. Environmental Protection Agency, "Colorimetric Screening Procedure for RDX and HMX in Soil," EPA Method 8510 [online], Revision 0, Feb. 2007 [retrieved on Jul. 24, 2012]. Retrieved from the Internet: <URL:http://www.caslab.com/EPA-Methods/PDF/EPA-Method-8510.pdf>.
Weinlick, "Additive Roll-to-Roll Manufacturing Techniques Being Developed," Mar. 2015, [online] [retrieved on Jun. 12, 2017]. Retrieved from the Internet: <URL: https://www.beyond.com/articles/additive-roll-to-roll-manufacturing-techniques-being-developed-16933-article.html>.
Zhang et al., "Self Cleaning Particle Coating with Antireflection Properties," Chem. Mater., 2005, 17, pp. 696-700.
Bertoldi et al., "Mechanically triggered transformations of phononic band gaps in periodic elastomeric structures," Physical Review B, 2008; 77: 052105.
Bertoldi et al., "Mechanics of deformation-triggered pattern transformations and superelastic behavior in periodic elastomeric structures," Journal of the Mechanics and Physics of Solids, 2008; 56: pp. 2642-2668.
Bertoldi et al., "Wave propagation and instabilities in monolithic and periodically structured elastomeric materials undergoing large deformations," Physical Review B, 2008; 78: 184017.
Kinge et al., "Self-assembling nanoparticles at surfaces and interfaces," ChemPhysChem, 2008; 9: pp. 20-42.
Ling, "Supramolecular layer-by-layer assembly of 3D multicomponent nanostructures via multivalent molecular recognition," Apr. 2008, International Journal of Molecular Sciences, vol. 9, pp. 486-497.
Lvov, "Alternate assembly of ordered multilayers of SiO2 and other nanoparticles and polyions," 1997, Langmuir, vol. 13, pp. 6195-6203.
Shevchenko et al., "Structural characterization of self-assembled multifunctional binary nanoparticle superlattices," J. Am. Chem. Soc., 2006; 128: pp. 3620-3637.
Shevchenko et al., "Structural diversity in binary nanoparticle superlattices," Nature, 2006; 439(5): pp. 55-59.
Shipway, Nanoparticle arrays on surfaces for electronic, optical, and sensor applications, 2000, ChemPhysChem, vol. 1, pp. 18-52.
Sigalas et al., "Classical vibrational modes in phonomic lattices: theory and experiment," Z. Kristallogr., 2005; 220: pp. 765-809.
Sunkara et al., "Solidification of colloidal crystals of silica," Hybrid Organic-Inorganic Composites, 1995; Chapter 14, ACS Symposium Series: pp. 181-191.
Wang et al., "Self-assembly of two- and three-dimensional particle arrays by manipulating the hydrophobicity of silica nanospheres," J. Phys. Chem. B., 2005; 109: pp. 22175-22180.

* cited by examiner

HEAT DISSIPATION USING NANOSCALE MATERIALS

FIELD OF THE INVENTION

The present invention relates to systems and methods for heat dissipation, and, more specifically, to systems and methods for use of nanoscale materials for heat dissipation. The present invention also finds use in electrical insulation.

BACKGROUND OF THE INVENTION

Electrical transmission and/or distribution lines experience significant losses because of heat generated by resistance. The Joule effect expresses the relationship between heat generated in a conductor and current flow, resistance, and time. In particular, the amount of heat released when passing electric current through a conductor is proportional to the square of the current. Moreover, as the conductor heats up, it becomes less conductive and causes even greater loss of energy due to heat.

Current transmission and/or distribution cables are typically aluminum conductor steel reinforced (ACSR) or aluminum conductor steel supported (ACSS). In ACSR cables, aluminum is the conductor and also supports the weight of the cable. In ACSS cables, the steel is used to support the weight of the cable, taking strain off of the aluminum. Due to the amount of current passing through transmission and/or distribution cables, significant heat is generated that results in wasted power and degradation of the cables. Current cables used for overhead power transmission typically have no insulation and instead rely on air to act as an insulator.

The economic cost of transmission and distribution losses was approximately $20.8 billion in the U.S. in 2014. In 2011, transmission and distribution losses were more than 2.3 billion kWh. Globally, transmission and distribution losses in 2011 were nearly 1.8 trillion kWh. Power loss could be reduced if systems were available to improve heat dissipation in transmission and/or distribution cables.

Similar issues occur in all types of cables and wires that carry electrical current. For example, heat losses are significant in power generation systems as well as wiring in houses and other end user buildings.

In the current process of solar energy generation using solar photovoltaic (PV) cells, a light wave hits a solar panel, which is essentially an assembly of PV cells with a coating to protect from ambient environmental conditions. The light wave then enters the PV cell, which is essentially a semiconductor material and excites the electrons in the material's atoms to higher energy states, producing heat as well as causing electrons to move between two layers, one negatively charged and the other positively charged. When the electrons move from the negatively charged layer to the positively charged layer, it corrects an imbalance and current is created. However, not all of the light wave that enters the PV cell can be processed. Produced as part of this process is waste heat—heat that raises temperature and that cannot be used for the generation of current. The amount of power produced is inversely proportional, that is, the higher the temperature, the less power produced.

Commercially available PV cells are only 5%-15% efficient. This means that between 95% and 85% of the light wave contacting a PV cell goes unused. In the June 2015-16 energy cycle, PV cell net generation from all sources is 27,119,000 mWh. Using this latest generation statistic, even an increase of 10% in efficiency, to between 15% to 25%, yields a PV cell net generation of 81,357,000 mWh.

Batteries depend on an electrochemical process whether charging or discharging and these chemical reactions are dependent on temperature. At the upper extremes of temperature, the active chemicals may break down and destroy the battery. Simply put, an increase in temperature causes a corresponding increase in the rate of unwanted chemical reactions which can cause internal current leakage between the positive and negative electrodes of the battery cell. Further, overheating can cause cells to break open resulting in a chain reaction of other cells rupturing. This is called thermal runaway and it is the cause of most battery explosions and battery swelling.

Lithium-ion battery technology has been a big part of the mobile revolution, and these batteries are increasingly showing up in cars and even airplanes. Lithium is used in batteries as an anode because it has extremely high electrochemical potential. That is, lithium-ion moving to the electrode produces a lot of energy. Lithium's low atomic weight is also useful in reducing the mass of batteries. While this makes lithium great for high-capacity batteries, these same properties make it highly reactive and more prone to thermal runaway.

Needs exist for improved systems and methods for heat dissipation.

BRIEF DESCRIPTION OF THE DRAWINGS

The accompanying drawings, which are included to provide a further understanding of the invention and are incorporated in and constitute a part of this specification, illustrate preferred embodiments of the invention and together with the detailed description serve to explain the principles of the invention. In the drawings.

DETAILED DESCRIPTION OF THE PREFERRED EMBODIMENTS

Figure 1:
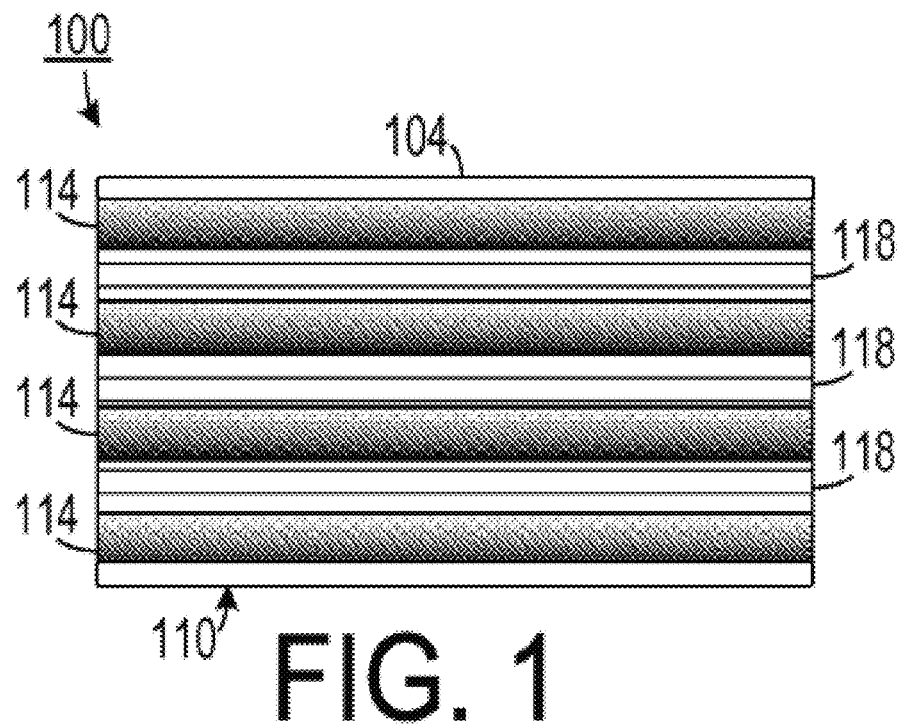
FIG. 1 is a schematic diagram of a heat dissipating system according to one exemplary embodiment.

Systems and methods are described for using various tools and procedures for heat dissipation. The examples described herein relating to electric transmission or distribution lines, photovoltaic cells, and batteries are for illustrative purposes only. The systems and methods described herein may be used for many different industries and purposes, including power generation and delivery, military, aerospace, sports and/or other industries completely. In particular, the systems and methods may be used for any industry or purpose where heat dissipation is needed.

Certain embodiments may include a structure and/or coating applied to a substrate. The structure and/or coating may dissipate heat generated from an object in contact with the structure and/or coating or from an outside heat source, such as, but not limited to, the sun.

In certain embodiments, a heat dissipation system may include a substrate. The substrate may be an object or article itself, or may be a material between the object or article and the structure and/or coating. In certain embodiments, the substrate may be an electric transmission and/or distribution line, a copper wire, etc. In certain embodiments, one or more components of turbines and/or generators may utilize the structure and/or coating. For example, the turbines and/or generators may be coated, or components thereof may be coated, such as wire coils, magnets, and conductors for electrical current. These materials may include aluminum stranded, steel, other metals and other materials that may undergo resistance heating. Voltages may range from approximately 120 V to approximately 765,000 V, and may reach a maximum temperature of approximately 500 C or higher. Any component or system that may be subject to Joule heating may be used in conjunction with the structure and/or coatings.

In certain embodiments, the substrate may be a polymer used to support the structure and/or coating. In certain embodiments, the substrate may be a polymer that is stable up to approximately 500 C or more. In certain embodiments, the substrate may be polyethylene terephthalate (PET), perfluoroelastomers, such as KALREZ® (manufactured by DUPONT®), polyimide engineering plastics, such as VESPEL® (manufactured by DUPONT®), polycarbonate and/or carbon fiber composites/laminates.

One or more heat dissipating layers may be disposed on at least a portion of the substrate. In certain embodiments, there may be two or more heat dissipating layers. In certain embodiments, there may be three or more, four or more, five or more, ten or more, twenty or more, thirty or more, forty or more, fifty or more, one hundred or more, heat dissipating layers disposed on at least a portion of the substrate.

Each one of the plurality of heat dissipating layers may include a gradient nanoparticle layer and/or a carbon allotrope layer.

A gradient nanoparticle layer may include a plurality of nanoparticles of at least two different diameters that are arranged in a gradient based on nanoparticle diameters. In certain embodiments, the gradient may be arranged from smallest particle diameters to largest particle diameters, largest particle diameters to smallest particle diameters, or any combination of increasing and decreasing patterns of diameters. The structure and/or coating may be a stack of ordered gradient nanoparticle structures of solid, hollow and/or filled nanoparticles, in a gradient array. A gradient array may be a structure that is tapered in one or more directions. Tapering in multiple directions may provide variation in particle size in multiple directions, including, but not limited to smallest to largest, largest to smallest, variable tapering, repeating patterns, etc. to create a layered structure. The stack of ordered gradient nanoparticle structures may be coated onto a substrate or may also be produced as a self-supported material.

In certain embodiments, the two different diameter nanoparticles may have a radius difference of approximately 10% or more. In certain embodiments, the two different diameter nanoparticles may have a diameter difference of approximately 5% or more. The differences in diameters may be applicable between each layer of the gradient nanoparticle layer.

In certain embodiments, the diameters of the nanoparticles may be less than approximately 500 nm. In certain embodiments, the diameters of the nanoparticles may be between approximately 100 nm and approximately 400 nm.

The nanoparticles may be made of various materials. In certain embodiments, the nanoparticles may be silica; aluminum hydroxide; polymeric materials; metal spheres, ceramics, and combinations thereof. In certain embodiments, the nanoparticles may be gold, silver, copper, aluminum, carbon nanotubes, graphene, etc. In certain embodiments, the nanoparticles may be polymers or ceramics. In certain embodiments, the polymers may be polystyrene. In certain embodiments, the ceramics may be silica. In certain embodiments, the nanoparticles may not be carbon allotropes.

The carbon allotrope layer may be disposed adjacent to the gradient nanoparticle layer. In certain embodiments, the carbon allotrope layer may be directly in contact with the gradient nanoparticle layer.

The carbon allotrope layer may include a plurality of carbon allotrope particles suspended in a matrix.

The carbon allotrope particles may include graphene sheets, carbon nanotubes, fullerenes, functionalized graphene sheets, functionalized carbon nanotubes, and functionalized fullerenes. In certain embodiments, the carbon allotrope particles are carbon nanotubes. In certain embodiments, the carbon allotrope particles are graphene. In certain embodiments, the carbon allotrope particles are functionalized. The functionalized carbon allotrope particles may be functionalized with carboxylic acid or amines, hydroxylated, or carboxylated.

The matrix may comprise one or more substances to hold the carbon allotropes in place. In certain embodiments, the matrix may be one or more polymers. In certain embodiments, the matrix may be poly(4 vinyl pyridine). In certain embodiments, the matrix may be a polymer that is stable up to approximately 500 C or more. In certain embodiments, the matrix may be polyethylene terephthalate (PET), perfluoroelastomers, such as KALREZ® (manufactured by DUPONT®), polyimide engineering plastics, such as VESPEL® (manufactured by DUPONT®), etc.

The one or more heat dissipation layers may have a thickness of between 0.001 mm and approximately 10 mm. In certain embodiments, the one or more heat dissipation layers may be approximately 1 mm in thickness, which does not include thickness from the substrate. The one or more carbon allotrope layers may have a thickness of between 150 nm and approximately 10 mm. In certain embodiments, the one or more carbon allotrope layers may be approximately 1 mm in thickness, which does not include thickness from the substrate. The substrate may have a thickness of between 0.001 mm and approximately 10 mm. In certain embodiments, the substrate may be approximately 1 mm in thickness.

As shown in FIG. 1, one embodiment of a heat dissipating material 101 may include a substrate layer 104 and a plurality 110 of shock attenuating layers disposed on the substrate layer. Each of the plurality 110 of shock attenuating layers may include a gradient nanoparticle layer 114 and a carbon allotrope layer 118 disposed adjacent to the gradient nanoparticle layer 114. In certain embodiments, the heat dissipating material 101 may include at least 10 gradient nanoparticle layers 114 alternating with at least 10 carbon allotrope layers 118 (while only three are shown in FIG. 1 for the sake of simplicity).

Figure 2A:
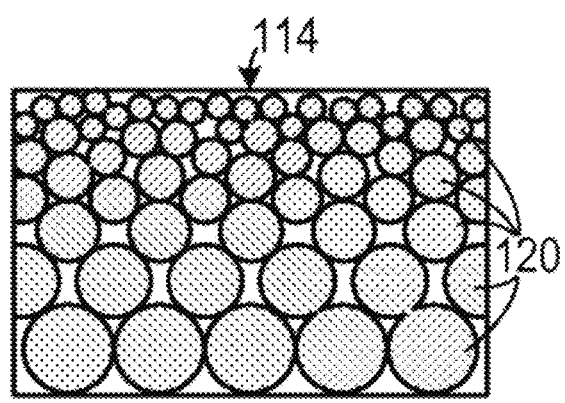
FIG. 2A is a schematic diagram of a gradient structure of a heat dissipating system according to one exemplary embodiment.

As shown in FIG. 2A, each nanoparticle layer 114 may include a plurality of nanoparticles 120 of different diameters (at least two different diameters) that are arranged in a gradient from smallest diameter to largest diameter. The specific orientation of the gradient (smallest to largest vs. largest to smallest) depends on the specific application for which the material is being used. Note that each nanoparticle layer 114 may include a sub-layer for each diameter nanoparticle. Each sub-layer may be the thickness of a single nanoparticle or may be the thickness of several nanoparticles. For example, the sub-layer may be approximately 1 nanoparticle thick, approximately 2 nanoparticles thick, approximately 3 nanoparticles thick, approximately 4 nanoparticles thick, approximately 5 nanoparticles thick, approximately 10 nanoparticles thick, etc.

Figure 2B:
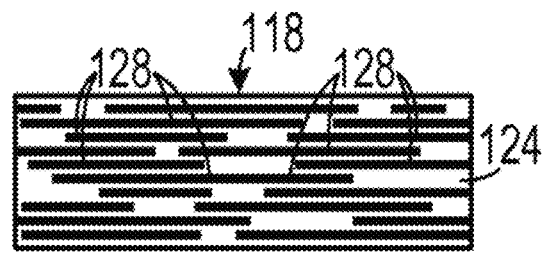
FIG. 2B is a schematic diagram of a carbon allotrope structure of a heat dissipating system according to one exemplary embodiment.

As shown in FIG. 2B, the carbon allotrope layer 118 may include a plurality of carbon allotrope members 128 suspended in a matrix 124. The carbon allotrope members 128 may include graphene sheets, carbon nanotubes, fullerenes, functionalized graphene sheets, functionalized carbon nanotubes, and functionalized fullerenes. The matrix 124 may be one or more polymers. In another aspect of the present invention, the carbon allotrope layer 118 may not comprise a matrix 124 or the carbon allotrope members 128 may not be suspended in a matrix 124.

Figure 3:
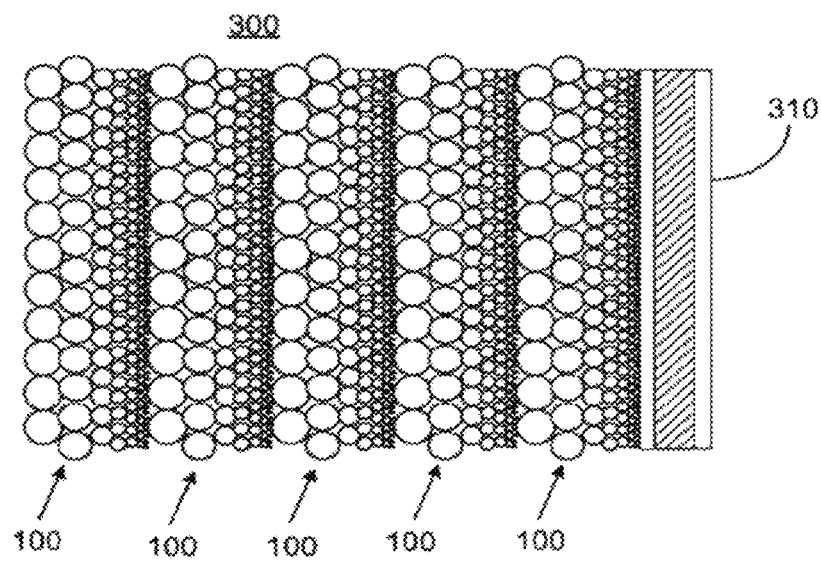
FIG. 3 is a schematic diagram of a heat dissipating system according to one exemplary embodiment.

As shown in FIG. 3, a plurality of the above described materials can be stacked or arranged sequentially one upon the other. For example, as shown in FIG. 3, a composite material sequence 300 may include a plurality of composite materials 100 stacked or arranged sequentially on top of a substrate 310. Specifically, FIG. 3 shows five composite materials 100. Each composite material 100 may include a gradient nanoparticle layer. Each composite material 100 may or may not include a carbon allotrope layer. To this end, it should be understood that any desired number of the layer sequence as shown for the composite materials 100 can be stacked or arranged in sequence.

Figure 4:
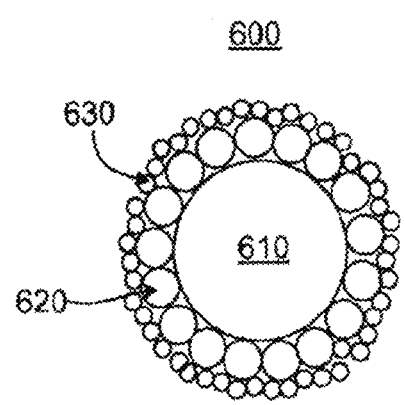
FIG. 4 is a schematic diagram of a heat dissipating system according to one exemplary embodiment.

As shown in FIG. 4, a plurality of layers can be oriented concentrically, thereby forming a concentrically layered system 600, such as for applications involving cylindrical substrates and/or coated objects. FIG. 4 illustrates a cross section of an electric transmission and/or distribution line. The concentrically layered system 600 may include a central substrate 610 surrounded by a plurality of concentric layers, only two layers 620 and 630 are shown but many more could be applied. As with the previous figures, each gradient nanoparticle layer may be capped by a carbon allotrope layer.

Figure 5:
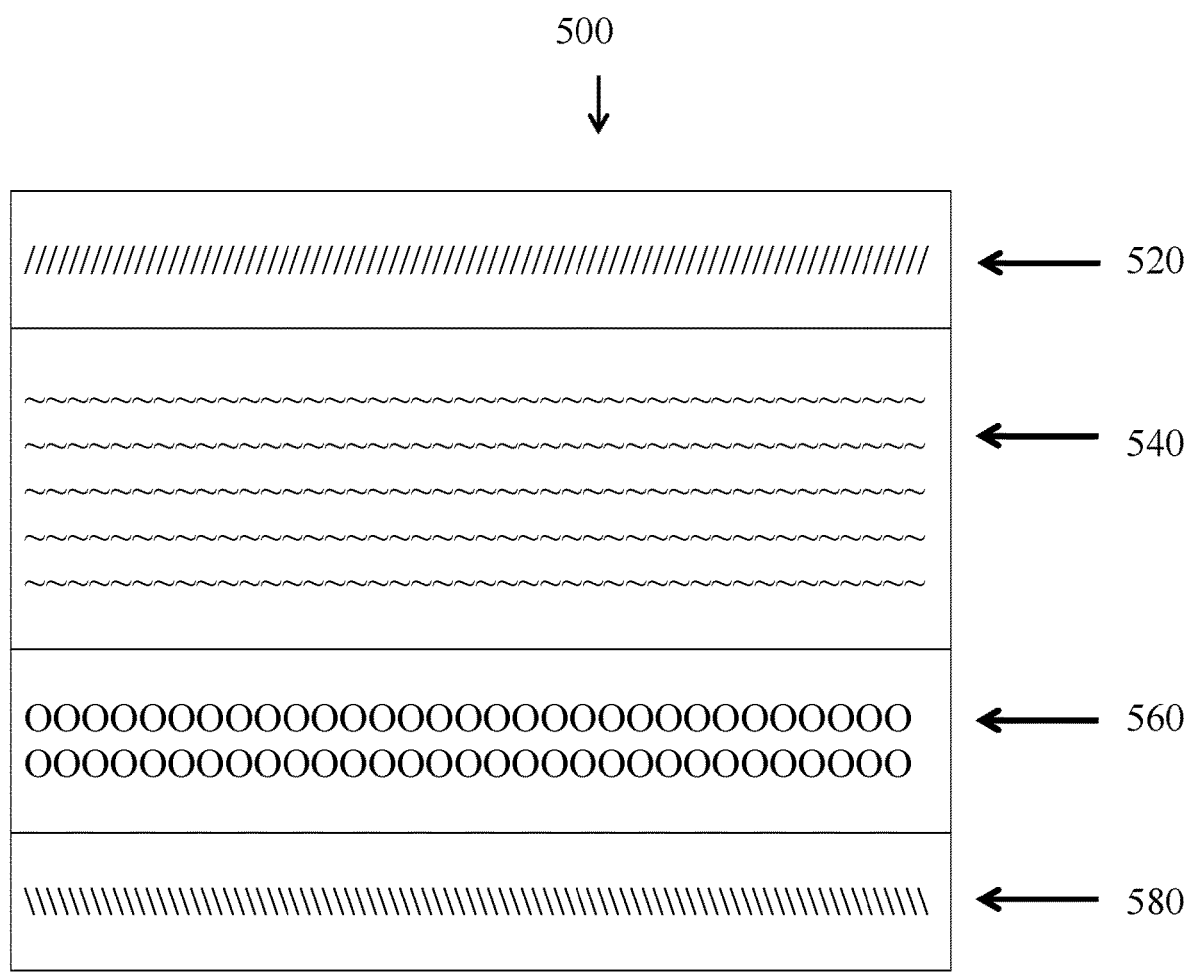
FIG. 5 is a schematic diagram of a heat sink solar cell comprising a gradient nanoparticle structure and other features.

A heat sink solar cell 500 is shown in FIG. 5. This Figure is intended to be illustrative and not exact or proportionate. Heat sink solar cell 500 has a protective layer or coating 520 over a semiconductor material 540. The semiconductor material 540 is bordered on another side by a gradient nanoparticle structure 560, which in turn is bordered by a structural layer 580. The integrated set of proper configurations of nanocomposite material can quickly absorb transient and steady heat and at the same time dissipate the stored energy into other energy forms (kinetic friction loss) to avoid a significant temperature rise in the material. In this manner, nanomaterial structures of various gradient spheres or cylinders or tubes may be formulated to optimally store significant energy while effectively dissipating the stored energy into other non-heat forms.

By adding a "heat sink" feature to PV cells through the use of one or more nanoparticle layers or—more preferably—gradient nanoparticle structure layers, each being preferably engineered to be about 1 millimeter in thickness, kinetic energy, i.e., heat, can be reduced by up to 50%. The structure achieves this attenuation by the use of one or more active and passive processes: absorption, reduction, distortion and redirection. Further, the amount of useful energy available may be increased by the use of carbon allotropes, e.g., carbon nanotubes or "CNTs", graphene, etc., because of the carbon allotrope's thermal conduction and energy storage capabilities.

The gradient nanoparticle structure, with a polymer (+) carbon allotrope layer, is applied to the surface of the bottom layer of the semiconductor material and/or the PV cell; however, embodiments where transparent or translucent layer(s) are also possible. As the light wave strikes the surface coating, it passes through that coating into the PV cell. The light wave generates current and waste heat. This waste heat is dissipated, in part, by the active and passive processes. Further, the polymer (+) carbon allotrope layer may be used to lengthen the amount of time that the useful energy remains in the PV cell. This: (1) increases availability of useful energy for the production of current; (2) stores a portion of that energy, which is released over time, again increasing the available useful energy; and (3) dissipates waste heat. The net effect is an increase in PV cell efficiency.

Embodiments of the present invention may also provide a method of dissipating heat. In certain embodiments, the method may include applying a plurality of heat dissipating layers on at least a portion of a substrate. The plurality of heat dissipating layers may each include a gradient nanoparticle layer including a plurality of nanoparticles of at least two different diameters that are arranged in a gradient based on nanoparticle diameters. The two different diameter nanoparticles may have a diameter and/or radius difference of approximately 10% or more. The diameters of the nanoparticles may be less than approximately 500 nm. The plurality of heat dissipating layers may each also include a carbon allotrope layer disposed adjacent to the gradient nanoparticle layer. The carbon allotrope layer may include a plurality of carbon allotrope members suspended in a matrix. The plurality of heat dissipating layers may be exposed to a heat source for dissipation of heat.

The heat source may be any source of heat, such as, but not limited to, solar heat, electrical resistance heating, such as from electrical power flowing through one or more electrical transmission or distribution lines, chemical heating, etc.

The plurality of heat dissipating layers may be applied to the substrate by various methods, such as spraying and/or dip coating and/or as a preformed film, and/or additive manufacturing and/or roll to roll manufacturing or any combination of these processes.

The heat dissipation systems and methods may employ both passive and active heat dissipation methods. Passive heat dissipation may be provided by the properties of the component materials absorbing and reradiating heat. While not wanting to be limited by theory, it is believed that active heat dissipation methods may be a result of vibration and/or movement of the nanoparticles and/or carbon allotrope particles within the structure and/or coating.

The structure and/or coating, when used for electrical conduction, may operate as a "heat sink". Carbon allotropes, such as carbon nanotubes and/or graphene have a tremendous thermal conductivity. As such, carbon allotropes may absorb a significant amount of heat relative to other materials, and in certain circumstances may be able to absorb nearly all heat applied to the materials.

In the generation of electricity, vibration is inevitable. This vibration over time may cause connections to loosen. The result may be (1) loss of energy, (2) electrical arcing, both "dry" and "wet", resulting in short circuits and fires, and/or (3) lost dollars. Due to the active and passive properties of the structure and/or coating described herein, when applied to the surface of a conductor, the structure and/or coating may reduce the amount of vibration and thereby reduce the loosening of connections with the related consequences.

The structure and/or coating may be applied to various materials using a variety of techniques. As a material, the structure and/or coating may be wrapped around one or more conductors in the same manner as a flexible tape wraps around a baseball bat handle, either before or after the conductors are spooled and/or before or after overhead and underground conductors are installed.

In certain embodiments, additive manufacturing may be used. Also, "roll to roll" additive manufacturing may be used to create the structure and/or coating on top of a substrate. In certain embodiments, a substrate may be run "roll to roll" and the nanoparticle and polymer matrix layers may be sprayed onto the substrate, thus building the composite "from the bottom up", rather than from the "top down", then applied to the surface of the conductor or other component. In certain embodiments, using additive manufacturing, the conductors may be coiled onto their spools, then unspooled. The structure and/or coating may be applied using a spray or wrapping method, and then coiling them up again onto spools.

For component parts, the parts may be sprayed with layers of nanoparticles and/or carbon allotropes after manufacture and before assembly. In certain embodiments, the structure and/or coating may be applied as a stand-alone material, preferably using some form of containment, to the outer and/or inner surface of each component.

The heat dissipation effect may result from a combination of passive and active physical processes, such as absorption and retransmission of input heat without appreciable heating. These effects may be independent of particle size. Individual particles in the final structure may be free to move relative to one another and/or vibrate to create contact points and transfer energy, such as heat.

The gradient nanoparticle structure (or layers) with or without the polymer (+) carbon allotrope layer may be applied to the surface of battery(s) or to a substrate that surrounds the battery(s). In this manner, the heat which is generated by the chemical reactions inherent in the production of electricity by the battery(s) can be dissipated. At the same time, the gradient nanoparticle structure (or layers) with or without the polymer (+) carbon allotrope layer, can help to maintain the ambient temperature surrounding the battery(s) to minimize the impact of that temperature on the operation of the battery(s).

For example, reportedly the TESLA® car battery consists of thousands of small cells insulated from each other to prevent thermal runaway; the nanoparticle structure could be incorporated into that insulation. This aspect of the invention is applicable to all batteries producing heat and/or subject to thermal runaway, as well as those requiring some protection from external temperature fluctuations. Similarly, the BOEING® 787® has batteries with eight large cells; the nanoparticle structure of the present invention could be used to insulate these batteries from ambient temperature changes as well as dissipate the heat generated by their use. For smart phones, laptops, tablets and similar electronic devices possessing batteries, such as lithium-ion, and processors, the amount of heat produced is largely proportional to the amount of electricity moving through such device. When a device approaches a potentially damaging temperature, the processor speed will be reduced. The nanoparticle structure could dissipate heat generated in these processes as well.

The heat dissipating system may be a lightweight coating that does not significantly change, if at all, the flexibility of the treated material or it may be a self-sustaining material. Importantly, the heat dissipating system can be made transparent by careful choice of nanoparticle materials.

Example 1

A heat dissipating system is applied to a length of electric transmission and/or distribution cable sufficient to allow measurement of heat dissipation. Comparative tests are conducted with standard electric transmission and/or distribution cables and those coated with the heat dissipation systems described herein.

Example 2

A heat sink solar cell (of a photovoltaic "PV" cell) is made through use of a gradient nanoparticle structure. A semiconductor material has a protective layer or coating applied to one or more sides. A gradient nanoparticle structure, comprising the characteristics described herein, is applied to another portion of, or one or more sides of, the semiconductor material. The protective layer may or may not overlap with some portions of the semiconductor material coated with a gradient nanoparticle structure (or layer(s)). The gradient nanoparticle structure (or layer(s)) may be partially or completely coated or covered by a structural layer. The gradient nanoparticle structure (or layer(s)) may be applied to the bottom layer of the semiconductor material, to the bottom layer of the PV cell, either or both. In those cases where a transparent solar cell is used, the gradient nanoparticle structure (or layer(s)) may be made transparent or translucent to allow the light wave to pass through it to the semiconductor material. The nanocomposite material can be configured in an integrated formation to permit quick absorption of transient and steady heat, and at the same time dissipate the stored energy into other energy forms (kinetic friction loss) to avoid a significant temperature rise in the material. Nanomaterial structures of various gradient spheres or cylinders or tubes are formulated to optimally store significant energy, while effectively dissipating the stored energy into other non-heat forms.

A "heat sink" feature is added to the PV cells through the use of one or more nanoparticle layers or—more preferably—gradient nanoparticle structure layers, each being preferably engineered to be about 1 millimeter in thickness. By this addition, kinetic energy, i.e., heat, is reduced by up to 50%.

The gradient nanoparticle structure (or layers), with a polymer (+) carbon allotrope layer, is applied to the surface of the bottom layer of the PV cell, whereby the light wave strikes the surface coating and passes through that structure, layer or coating into the PV cell. The light wave generates current and waste heat. This waste heat is dissipated, in part, by the active and passive processes. Further, the polymer (+) carbon allotrope layer, structure or coating can be used to lengthen the amount of time that the useful energy remains in the PV cell.

Although the foregoing description is directed to the preferred embodiments of the invention, it is noted that other variations and modifications will be apparent to those skilled in the art, and may be made without departing from the spirit or scope of the invention. Moreover, features described in connection with one embodiment of the invention may be used in conjunction with other embodiments, even if not explicitly stated above.

What is claimed is:

1. A heat dissipation system comprising:
    a substrate;
    a plurality of heat dissipating layers on at least a portion of the substrate, each one of the plurality of heat dissipating layers comprising:
    (i) a gradient nanoparticle layer comprising a plurality of nanoparticles including first nanoparticles each having a first diameter and second nanoparticles each having a second diameter, wherein the first diameter and the second diameter differ from one another in length by 10% or more and wherein each of the first diameter and the second diameter is less than 500 nm in length; and
    (ii) a carbon allotrope layer disposed adjacent to the gradient nanoparticle layer, the carbon allotrope layer comprising a plurality of carbon allotrope particles suspended in a matrix, wherein the matrix comprises one or more polymers heat stable up to 500 C.

2. The system of claim 1, wherein the substrate is an electrical transmission line.

3. The system of claim 1, wherein the substrate is a substrate selected from the group consisting of a wire coil in a turbine, a magnet in a turbine, a conductor in a turbine, a conductor in a generator, and a photovoltaic cell.

4. The system of claim 1, wherein the plurality of nanoparticles comprises polymers or ceramics.

5. The system of claim 1, wherein the plurality of nanoparticles comprises polystyrene or silica.

6. The system of claim 1, wherein the plurality of nanoparticles are not carbon allotrope members.

7. The system of claim 1, wherein the plurality of carbon allotrope particles comprises carbon nanotubes.

8. The system of claim 1, wherein the plurality of carbon allotrope particles comprises graphene.

9. The system of claim 1, wherein the plurality of carbon allotrope particles comprises functionalized carbon allotrope particles.

10. The system of claim 9, wherein the functionalized carbon allotrope particles are functionalized with amine, hydroxy, or carboxy functional groups.

11. The system of claim 1, wherein the plurality of heat dissipating layers is 1 mm thick.

12. A method of dissipating heat, the method comprising:
    applying a plurality of heat dissipating layers on at least a portion of a substrate, wherein the plurality of heat dissipating layers each comprise:
    (i) a gradient nanoparticle layer comprising a plurality of nanoparticles including first nanoparticles each having a first diameter and second nanoparticles each having a second diameter, wherein the first diameter and the second diameter differ from one another in length by 10% or more and wherein each of the first diameter and the second diameter is less than 500 nm in length; and
    (ii) a carbon allotrope layer disposed adjacent to the gradient nanoparticle layer, the carbon allotrope layer comprising a plurality of carbon allotrope particles suspended in a matrix, wherein the matrix comprises one or more polymers heat stable up to 500 C; and
    exposing the plurality of heat dissipating layers to a heat source.

13. The method of claim 12, wherein the heat source is electrical resistance.

14. The method of claim 13, wherein the electrical resistance is from power flowing through one or more electrical transmission or distribution lines.

15. The method of claim 12, wherein the heat source is solar.

16. The method of claim 12, wherein the applying is achieved by spraying each of the plurality of heat dissipating layers on the substrate.

17. The method of claim 12, wherein the applying is achieved by dip coating each of the plurality of heat dissipating layers on the substrate.

18. The method of claim 12, wherein the applying is achieved by additive manufacturing each of the plurality of heat dissipating layers on the substrate.

19. The method of claim 12, further comprising reducing the temperature of the substrate.

* * * * *